(12) United States Patent
Pfennig et al.

(10) Patent No.: US 9,577,119 B2
(45) Date of Patent: Feb. 21, 2017

(54) SOLAR MODULE WITH A PLUG-IN DEVICE

(71) Applicant: HANWHA Q.CELLS GMBH, Bitterfeld-Wolfen (DE)

(72) Inventors: Andreas Pfennig, Leipzig (DE); Maximilian Scherff, Dortmund (DE)

(73) Assignee: HANWHA Q.CELLS GMBH, Bitterfeld-Wolfen (DE)

( * ) Notice: Subject to any disclaimer, the term of this patent is extended or adjusted under 35 U.S.C. 154(b) by 338 days.

(21) Appl. No.: 13/912,446

(22) Filed: Jun. 7, 2013

(65) Prior Publication Data

US 2013/0327372 A1 Dec. 12, 2013

(30) Foreign Application Priority Data

Jun. 7, 2012 (DE) .................. 10 2012 104 942

(51) Int. Cl.
*H01L 31/02* (2006.01)
*H02S 40/34* (2014.01)

(52) U.S. Cl.
CPC .. *H01L 31/02008* (2013.01); *H01L 31/02013* (2013.01); *H02S 40/34* (2014.12); *Y02B 10/12* (2013.01); *Y02E 10/50* (2013.01)

(58) Field of Classification Search
CPC .................... H01L 31/02008; H01L 31/02013
See application file for complete search history.

(56) References Cited

U.S. PATENT DOCUMENTS

| | | |
|---|---|---|
| 4,457,578 A | 7/1984 | Taylor |
| 6,235,984 B1 | 5/2001 | Wambach et al. |
| 2002/0193001 A1 | 12/2002 | Yoshikawa et al. |
| 2005/0022859 A1 | 2/2005 | Nass et al. |
| 2007/0287322 A1 | 12/2007 | Machado et al. |

(Continued)

FOREIGN PATENT DOCUMENTS

| | | |
|---|---|---|
| DE | 10334935 B3 | 12/2004 |
| DE | 20 2009 007 523 U1 | 9/2009 |

(Continued)

OTHER PUBLICATIONS

DE 10 2009 039370 A1 machine translation, translated on Dec. 1, 2014.*

(Continued)

*Primary Examiner* — Golam Mowla
(74) *Attorney, Agent, or Firm* — Heslin Rothenberg Farley & Mesiti P.C.; Victor A. Cardona, Esq.

(57) ABSTRACT

A solar module with a front side surface and a rear side surface, has a front side encapsulation element which forms the front side surface of the solar module, a multiplicity of solar cells which are connected electrically to one another, a rear side encapsulation element which forms the rear side surface of the solar module with a rear side surface plane and has a polymer plastic film, and at least one plug-in device connecting to a complementary structure. The plug-in device is at least partially laminated into the rear side encapsulation element, in the region of an overlapping section, wherein the rear site encapsulation element has an opening and the plug-in device is arranged at least partially in the opening. The plug-in device projects beyond the rear side surface plane of the solar module by a maximum of 15 mm.

20 Claims, 5 Drawing Sheets

(56) References Cited

U.S. PATENT DOCUMENTS

2008/0257402 A1    10/2008  Kamp et al.
2012/0132249 A1     5/2012  Purucker et al.

FOREIGN PATENT DOCUMENTS

| | | |
|---|---|---|
| DE | 10 2008 048 443 A1 | 4/2010 |
| DE | 10 2009 053 018 A1 | 5/2010 |
| DE | 10 2009 039 370 A1 | 11/2010 |
| DE | 10 2010 053 151 A1 | 5/2012 |
| EP | 1 006 593 A1 | 6/2000 |
| EP | 1 496 577 A2 | 12/2005 |
| JP | 2000-357812 | 12/2000 |
| WO | 2007/045695 A1 | 4/2007 |
| WO | 2010/034638 A2 | 4/2010 |
| WO | 2010/054841 A3 | 5/2010 |
| WO | 2010054841 A2 | 5/2010 |
| WO | 2010098685 A1 | 9/2010 |

OTHER PUBLICATIONS

Search Report in corresponding DE Application No. 102012104942, dated Aug. 2, 2013, 2 pages.
Jan. 30, 2013 Office Action from corresponding German Application No. DE 10 2012 104 942.4.

\* cited by examiner

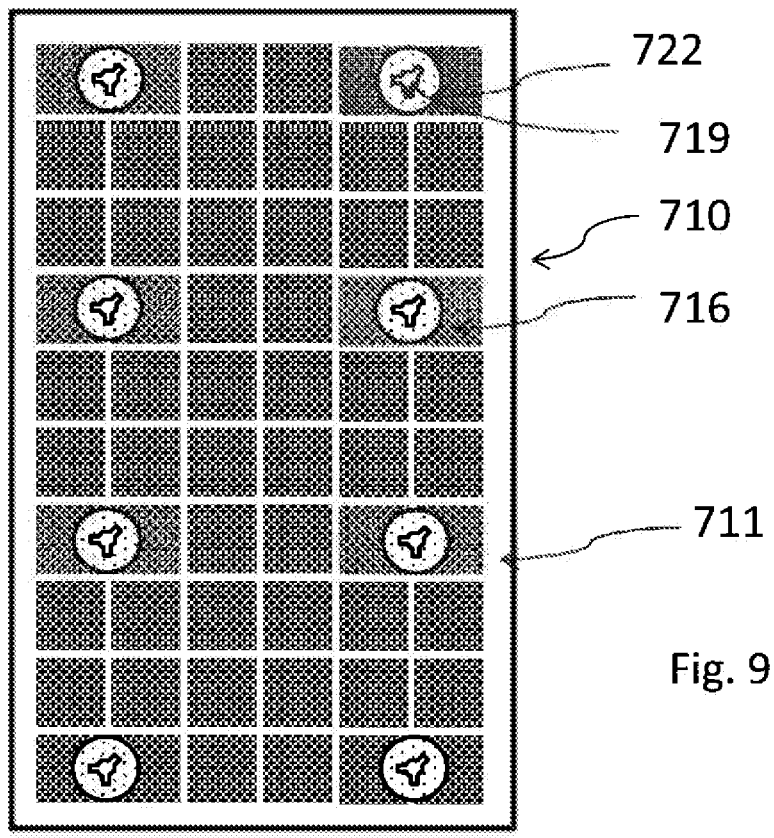
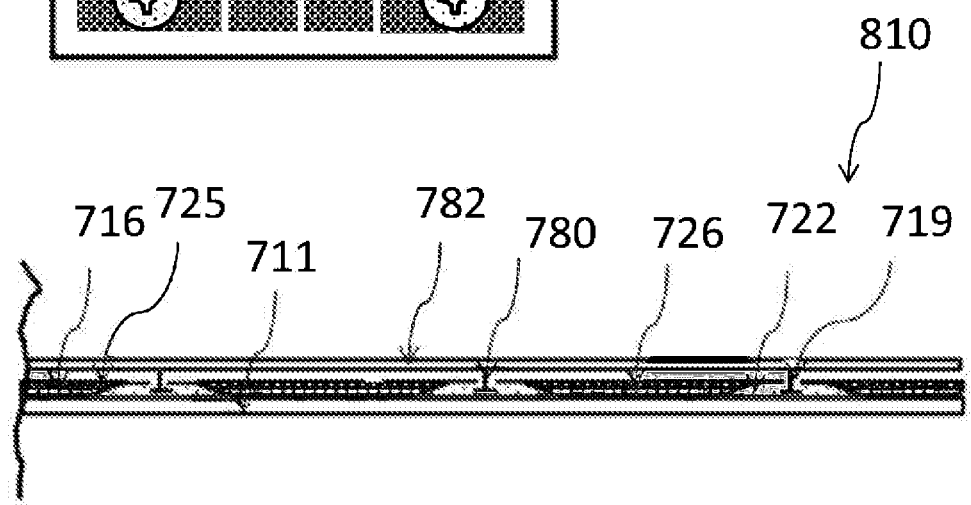
Fig. 9
Fig. 10

100
SOLAR MODULE WITH A PLUG-IN DEVICE

CROSS-REFERENCE TO RELATED APPLICATIONS

This application claims priority to German Patent Application No. 102012104942.4 filed on Jun. 7, 2012, the entire disclosure of which is incorporated by reference.

DESCRIPTION

The present invention relates to a solar module with a plug-in device, in particular, the present invention relates to a solar module with a multi-functional plug-in device. The multi-functional plug-in device permits a multiplicity of objects to be attached to the solar module.

The attachment of solar modules to roofs of houses and/or to fronts of buildings as well as the attachment of electrical module terminals to solar modules and/or the functional coupling of diodes, in particular as bypass diodes, to solar modules generally requires a multiplicity of components which have to be fastened to a solar module. In addition to possible incorrect mounting there is also the problem that the fastened components require space and therefore, for example, mounting solar modules which are ready made and merely have to be mounted on a roof of a house and/or on the front of a building entails high storage and transportation costs owing to their poor stacking capability.

Stringent requirements are made of electrical module terminals. A socket is supposed to be composed of as few components and as little material as possible in order to be cost-effective. The connecting technology between the socket and the solar module has to be mechanically flexible, watertight and dust tight and long-term stable. Therefore, attaching electrical module terminals is problematic and entails a large amount of expenditure.

Module terminals can be configured, for example, as a socket which has two diodes in the interior and two cables and which is bonded onto the rear side of the solar module, as is described in US 2002 0193001 A1. The socket is bonded on, then the cross-connectors which project out of the solar module are connected in the socket, and the socket is then closed off with a lid. In this context, a cast plug-element is used which is laminated-in, wherein the expression "cast" means that in the case of the vulcanized plug the internal components are not accessible without destroying the plug.

EP 1 496 577 B1 describes a housing for a solar module into which a bypass diode is plugged. The bypass diode can therefore be exchanged. The housing can be attached to a solar cell module.

In addition to solar modules with what are referred to as "central terminals", i.e. the socket which contains all the bypass diodes is arranged centrally, solar modules can also have what are referred to as decentralized sockets which are not arranged centrally on the solar module but instead in a decentralized fashion.

DE 202009007523 U1 describes, for example, a solar module with bonded-on decentralized sockets which each contain a diode.

In the case of decentralized electrical module terminals, bypass diodes can be located, for example, in the sockets, or in the case of a solar module laminate in the laminate of the solar module. In both cases, the diode cannot be exchanged. The diode cannot be reached in the laminate without breaking open the laminate. In the socket the diode is usually cast in silicone in order to ensure a seal with respect to the solar module because the module terminal has to be sealed, as already mentioned. Therefore, the sockets cannot be opened without damage. The diodes can at most be exchanged by specialist personnel. When such damage occurs, the warranty of the socket manufacturer is lost. A defective diode can therefore require a solar module to be exchanged, thereby entailing high costs.

Alternatively, a solar module can have laminated-in sockets. In addition to the problems of the sockets mentioned above, there is also the problem here that it is costly to adapt a laminator to the exterior contour of the socket for laminating said socket in. Usually, solar modules are attached mechanically by means of clamps. As a result of the clamping attachment to the edge of the solar module, the bending of the solar module during stress tests and during operation with distributed loads such as, for example, wind and snow, and dynamic loading such as in the case of storm, is comparatively large. Since the mechanically neutral phase of the solar module is not in the cell plane, damaging shearing forces occur in the cell plane and/or tensile stresses occur at the cell connectors which can lead to fracturing of the cell and contact problems. A solar module can be supported in a distributed fashion with rails which are bonded on. A reliable permanent connection is therefore difficult to achieve. A different attachment possibility is therefore desirable.

An object of the present invention is to make available a solar module which provides a simple, stable and weather-proof attachment possibility for various types of components, which also permits the various types of components to be exchanged easily and simply.

According to the invention, the object is achieved by means of a solar module as claimed in claim 1.

Advantageous refinements of the present invention are specified in the dependent claims.

According to the invention, a solar module with a front side surface and a rear side surface is made available. The solar module has a front side encapsulation element which forms the front side surface of the solar module, a multiplicity of solar cells which are connected electrically to one another, a rear side encapsulation element which forms the rear side surface of the solar module with a rear side surface plane and has a polymer plastic film, and at least one plug-in device for connecting to a complementary structure.

The plug-in device is at least partially laminated into the rear side encapsulation element in the region of an overlapping section. The rear side encapsulation element has an opening. The plug-in device is arranged at least partially in the opening. The plug-in device projects beyond the rear side surface plane of the solar module by a maximum of 15 mm.

The plug-in device hardly protrudes out of the rear side surface plane of the solar module but instead is of comparatively flat design when viewed transversely with respect to the surface. As a result, the plug-in device can already be laminated into the solar module, at least partially in the region of an overlapping section, before a lamination process in which the rear side encapsulation element is laminated onto the plug-in device or the solar cells, without the need for retrofitting commercially available lamination systems. If appropriate, the plug-in device can be placed in contact with a cross-connector before the lamination process if said plug-in device has an electrical terminal.

The plug-in device is laminated into the rear side encapsulation element in the region of an overlapping section. If the plug-in device has an electrical terminal, the electrical terminal is not exposed to the weather. That is to say the electrical terminal is installed in a weatherproof fashion in the solar module. The expression in "a weatherproof fashion" means according to the present invention, in particular, that the electrical terminal is protected against environmental influences such as wetness such as, for example, spray water or penetrating dampness and dirt such as, for example, dust in an operating temperature range from +10° C. to at least +60° C. As a result of the laminating of the plug-in device in the region of an overlapping section into the rear side encapsulation element, on the one hand there is a saving in materials such as adhesive pads and adhesives and, on the other hand, integration of the plug-in device into the rear side encapsulation element allows the strength of the assembly composed of the plug-in device and the rear side encapsulation element to be increased. The at least partial laminating into the rear side encapsulation element protects the plug-in device against working loose or dropping off over the long term.

According to the present invention, the expression "plug-in device" is understood to be a device which is embodied in such a way that it can adopt a complementary structure in such a way that it is connected thereto. The plug-in device and/or the complementary structure can have female and/or male elements.

According to the present invention, the expression "overlapping section" is understood to be a section in which the plug-in device is laminated into the rear side encapsulation element with the result that parts of the plug-in device overlap with parts of the rear side encapsulation element.

The overlapping section is implemented, in particular, by virtue of the fact that the opening of the rear side encapsulation element has a base area which is smaller than the base area of the plug-in device. The base area of the opening and the base area of the plug-in device have preferably the same shape but are of different sizes. The relatively small base area of the opening compared to the base area of the terminal housing ensures that the plug-in device is laminated securely into the rear side encapsulation element at least in the overlapping section. The overlapping section preferably has a constant width. The constant width of the overlapping section has the advantage that mechanical stresses between the terminal housing and the rear side encapsulation element act in a spatially uniform fashion on the solar module and said constant width is therefore advantageous for the long-term stability of the solar module.

The rear side encapsulation element has a polymer plastic film. The rear side encapsulation element preferably has an embedding polymer and a rear side encapsulation structure. The embedding polymer is preferably arranged on the plug-in device or the multiplicity of semiconductor wafer solar cells and the rear side encapsulation structure on the embedding polymer. The plug-in device is preferably laminated into the embedding polymer. In particular ethylene vinyl acetate is possible as the embedding polymer. Further examples of the embedding polymer are silicone rubber, polyvinyl butyral, polyurethane or polyacrylate. An example of the rear side encapsulation structure is, fir example, a rear side film made of TEDLAR® (registered trademark of DuPont, Wilmington, USA). The front side encapsulation element can have an embedding polymer and a front side encapsulation structure. The embedding polymer can be selected from the examples listed above of the embedding polymer of the rear side encapsulation element. The front side encapsulation structure is usually constructed from glass, but it can also comprise sufficiently transparent plastics.

The embedding polymer is preferably also arranged between the plug-in device and the solar cells. That is to say an embedding polymer laminate layer is located between the plug-in device and solar cells. The embedding polymer above can be selected from the examples listed above of the embedding polymer of the rear side encapsulation element, and is preferably selected in such a way that it is the same material which is used for the embedding polymer of the rear side encapsulation element.

The solar cells are preferably semiconductor wafer solar cells such as, for example, silicon solar cells.

The plug-in device preferably projects beyond the rear side surface plane of the solar module by a maximum of 6 mm. Even more preferably, the plug-in device projects beyond the rear side surface plane of the solar module by a maximum of 4 mm. The smaller the degree by which the plug-in device projects beyond the rear side surface plane, the better the plug-in device can be laminated into the rear side encapsulation element. The plug-in device projects beyond the rear side surface plane preferably by at least 1 mm.

In a preferred embodiment, the plug-in device has, in the direction perpendicular to the rear side surface, a maximum height which is less than 10% of an average diameter value which is formed from a maximum diameter and from a minimum diameter of the plug-in device which are represented in the plan view of the rear side surface plane. The plug-in device more preferably has, in the direction perpendicular to the rear side surface, a maximum height which is less than 8% of an average diameter value which is formed from a maximum diameter and from a minimum diameter of the plug-in device. The plug-in device even more preferably, in the direction perpendicular to the rear side surface, a maximum height which is less than 5% of an average diameter value which is formed from a maximum diameter and from a minimum diameter of the plug-in device which are represented in the plan view of the rear side surface plane. That is to say the plug-in device is of very flat design compared to its geometric extent in the directions of the rear side surface plane.

The plug-in device preferably has a housing. The plug-in device itself alternatively forms a housing. If the plug-in device forms just one housing, i.e. does not contain any further, in particular electrical, components, then it is suitable, in particular, as a mounting point for mechanical solar module attachment. A contact face which is formed plane-parallel with respect to the rear side surface plane advantageously has at least one opening which is suitable for receiving a complementary structure. i.e., a structure with at least one projection, in such a way that the complementary structure is securely anchored but can be released again when necessary, for example when the solar module is defective. The plug-in device can alternatively or additionally have at least one projection. In this case, the complementary structure suitably has at least one opening in a corresponding alternative or additional fashion. Alternatively or additionally, the plug-in device and the complementary structure can have latching elements.

In one preferred embodiment, the plug-in device has at least a first contact, which is electrically connected to the solar cells, and at least a second contact, which is suitable for being contacted by the complementary structure. The complementary structure is then preferably embodied as a plug which brings about an electrical contact-forming process of the solar cells of the solar module via the second contact. The first and second contacts can be embodied in one piece. The plug-in device is suitable in this embodiment to be connected to a diode in a plug, a chip card or the like. The diode is preferably detachably connected to the plug-in device via the plug or the chip card. In this case, the diode can easily be exchanged since it is not laminated into the solar module but rather plugged with the plug or the chip card into the plug-in device.

The plug-in device preferably has at least one electrical terminal, at least one diode and/or at least one bypass diode.

Since the plug-in device is, specifically, partially laminated into the rear side encapsulation element in the region of an overlapping section, it cannot drop off. The plug-in device is in this case embodied in such a way that it is connected to at least two cross-connectors of the solar module. The complementary structure can in this case be a cable with a plugging structure at one end which is complementary to the plug-in device, wherein the cable has to be preferably nondetachably connected to the plug-in device.

In one preferred embodiment, the plug-in device has a contact face for connecting the complementary structure, which contact face is arranged plane-parallel with respect to or in the rear side surface plane.

In one preferred embodiment, the plug-in device has a contact face for connecting the complementary structure, which contact face is arranged plane-parallel with respect to or in the rear side surface plane. This embodiment is advantageous if the plug-in device is embodied as a housing, has at least one opening and/or at least one latching element and serves as a mounting point for attaching the solar module. In this case, the complementary structure can be inserted at an angle, preferably perpendicularly, into the at least one opening or the at least one latching element. Furthermore, in this embodiment the plug-in device can also have an electrical terminal, a diode and/or a bypass diode, an electronic circuit or other electrical contacts.

The electrical contacts, the electrical terminal, the diode and/or the bypass diode can be oriented in such a way that they can be contacted electrically in a plane-parallel fashion with respect to the rear side surface plane, but they can also be oriented differently. For example, it is possible for the contact face to be embodied plane-parallel with respect to the rear side surface plane, and to have at least one opening and/or at least one latching element, but for the electrical contact, the electrical terminal, the diode and/or the bypass diode not to be arranged in the contact face.

The housing preferably has at least two parts. At least one laminated-in region of at least one part has at least one opening which permits a frictionally locking connection between the parts of the housing. This embodiment is advantageous if the plug-in device has not only the housing but also further components such as an electrical contact, an electrical terminal, a diode and/or a bypass diode. These components can be located between the at least two parts of the housing and can be enclosed in a dust tight and watertight fashion in the housing.

In a further preferred embodiment, in a laminating-in region in which the plug-in device is laminated into the rear side encapsulation element, the plug-in device has depressions which are suitable for accommodating rear side encapsulation element material. During the laminating of the plug-in device into the rear side encapsulation element it is possible, depending on the selection of the material or materials for the rear side encapsulation element, that the rear side encapsulation element swells during the laminating process and protrudes perpendicularly with respect to the rear side surface plane, i.e. swells out at the sides of the solar module. This can be the case, for example, if the rear side encapsulation material has an embedding polymer such as, for example, ethylene vinyl acetate and a rear side encapsulation structure such as, for example, a glass panel or plastic film. During the lamination process the embedding polymer, which is arranged between the plug-in device or the solar cells and the rear side encapsulation structure, can swell out of the solar module in the region of the openings of the rear side encapsulation structure. In order to prevent this, in the laminating-in region in which the plug-in device is laminated into the rear side encapsulation element, the plug-in device preferably has depressions which are suitable for accommodating the embedding polymer if necessary. According to the present invention, the expression "laminating-in region" is understood to be a region at which the laminating of the plug-in device into the rear side encapsulation element ends and the region of the plug-in device which is not covered by the rear side encapsulation element, that is to say is not laminated in, starts. In this context, a laminating-in region comprises an end region of an overlapping section which is adjoined by a junction region. A junction region is, according to the present invention, a region which represents the junction of a laminated-in part of the plug-in device and of an uncovered part of the plug-in device.

The plug-in device preferably has at least one spacing element which extends between solar cells and is supported on the front side encapsulation element. As a result, the arrangement of the plug-in device in the laminate assembly is mechanically stabilized and conducts away forces in the direction of the front side encapsulation element.

In a preferred embodiment, the solar module also comprises the complementary structure. The complementary structure is connected to the plug-in device. The complementary structure is embodied as a function of the plug-in device. If the plug-in device or its contact face has at least one opening, the complementary structure has at least one correspondingly complementary projection, and vice versa.

The complementary structure can be embodied, for example, as an underframe which is suitable for being fastened to a supporting structure, a roof of a house and/or a front of a building. In this case, the underframe preferably has a predetermined number of projections which are suitable to be connected to the predetermined number of plug-in devices, preferably in a frictionally locking fashion. The predetermined number of projections is preferably equal to the predetermined number of plug-in devices.

The complementary structure can alternatively be embodied as a plug which has electrical contacts and/or an exchangeable diode. The plug can be connected to a cable. The plug can have dimensions which permit it to be able to be at least partially plugged into an opening in the plug-in device and be turned in order to connect to the plug-in device in such a way that it is arranged at least partially under regions in the plug-in device which are adjacent to the opening and can be removed again from the plug-in device by turning into the dimensions of the opening and taking it out.

Furthermore, the complementary structure can alternatively be embodied as a chip card. In this case, electrical contacts and/or an exchangeable diode and/or bypass diode are located in a very flat housing, i.e. a card-shaped housing. The chip card is embodied in such a way that it can be plugged into the plug-in device and anchored thereto.

According to the invention, the complementary structure can have an electrical contact and/or a bypass diode, and/or the plug-in device contains an electrical terminal and/or a bypass diode.

In one advantageous embodiment, the complementary structure has an exchangeable diode, and the plug-in device has two contacts which are placed in contact with the diode in the complementary structure. The complementary structure can be a plug or a chip card. The electrical contacts of the plug-in device are connected to at least two cross-connectors.

In one alternative embodiment, the plug-in device has a diode, and the complementary structure has electrical contacts. If the plug-in device is configured in such a way that it can be opened, the diodes in the plug-in device can be exchanged.

The connection between the plug-in device and the complementary structure can be produced by turning or pushing. The connection is preferably positively and/or frictionally locking.

If the connection is made by means of pushing, the plug-in device and the complementary structure can preferably also have latching-in elements which prevent the connection from being able to become disconnected.

In one preferred embodiment, the complementary structure and the plug-in device are connected to one another in the manner of a bayonet closure. The bayonet closure ensures a mechanical connection between the plug-in device and the complementary structure which can be produced and disconnected quickly. The plug-in device and the complementary structure are connected by plugging one into the other and turning in opposite directions, and in this way also disconnected again. For example, the complementary structure has a longitudinal slot at the end of which a short transverse slot starts at a right angle, and the plug-in device has a knob which is inserted into the transverse slot, or vice versa. The bayonet-closure-like connection is made by means of a plug and turn movement. The plug-in device and the complementary structure at the connecting point are placed one in the other; elongate elevations are made in the plug-in device and the complementary structure at the connecting point approximately perpendicularly with respect to the plugging direction. However, said elevations do not run all around but are instead interrupted. Since the elevations are then located slightly obliquely in the plane perpendicular to the plugging direction, a turning movement causes the plug-in device and the complementary structure to be, as it were, pressed one against the other in the manner of a thread. As an alternative to the elevations on the plug-in device and the complementary structure, the plug-in device can also have at least one depression and the complementary structure can have at least one complementary protrusion, or vice versa. If necessary the connection can also be secured by means of latching-in elements which are arranged on the plug-in device and the complementary structure. The plug-in device and/or the complementary structure preferably has a seal which is configured in such a way that the connecting region in which the complementary structure can be connected to the plug-in device is sealed. This embodiment ensures that neither dust nor water penetrate between the plug-in device and the complementary structure. This is important, in particular, if the plug-in device and/or the complementary structure have at least one electrical contact, electrical terminal, diode and/or bypass diode.

In one preferred embodiment, the plug-in device and/or the complementary structure has a sealing element which is arranged in such a way that it covers a junction region which constitutes the junction of a laminated-in part of the plug-in device and of an uncovered part of the plug-in device. The sealing element prevents the penetration of water and/or dust. The penetration of dust or moisture can lead to slow detachment of the lamination layers.

The complementary structure preferably contains at least one electrical terminal, at least one diode and/or at least one bypass diode. The diode and/or bypass diode can be securely integrated into the complementary structure or configured as exchangeable components. In the last case, the complementary structure can have multiple parts.

The plug-in device and/or the complementary structure is preferably non-detachably connected to at least one cable. In particular, the plug-in device is connected to at least one cable if said plug-in device has an electrical terminal, a diode and/or a bypass diode. The cable then has at one end the complementary structure which is connected to the plug-in device. Alternatively or additionally the complementary structure can be non-detachably connected to a cable if said complementary structure also has an electrical terminal, a diode and/or a bypass diode.

The present invention will now be explained in more detail with reference to figures without restricting the invention thereto. All the figures are schematic and not to scale. Identical components used in the figures have the same reference symbols.

In the drawings:

FIG. 9 shows a plan view of a further solar module according to the invention; and FIG. 10 shows a partial cross-sectional view of a further solar module according to the invention.

Figure 1:
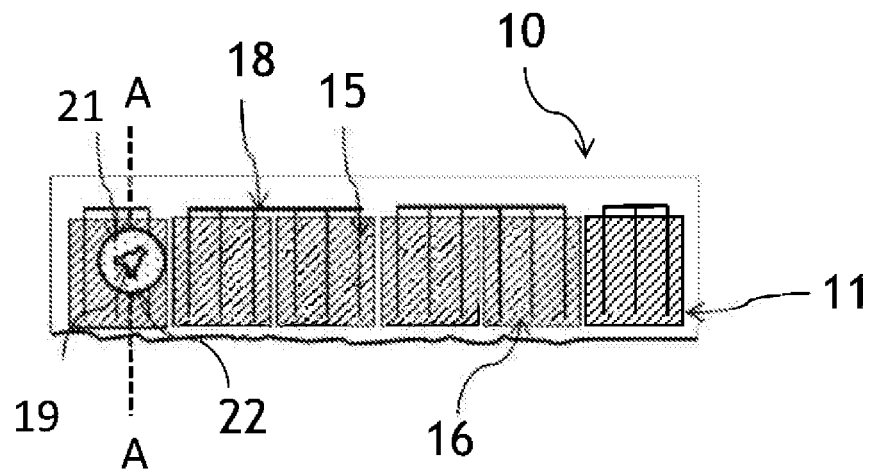
FIG. 1 shows a partial plan view of the rear side of a solar module according to the invention.

FIG. 1 shows a partial plan view of the rear side of a solar module 10 according to the invention. The rear side encapsulation element is not shown in the partial plan view of the solar module 10. A multiplicity of solar cells 16 (of which six are shown by way of example) are arranged on a front side encapsulation element 11 and electrically connected to one another by means of cross-connectors 18. The cross-connectors 18 are electrically connected to busbars 15 which extend on the solar cells 16. A plug-in device 22 is arranged on a solar cell 16. The plug-in device 22 is embodied with a floor region in a planar fashion in the rear side surface plane which is defined by the substantially two-dimensional extent of the solar module. The plug-in device 22 is partially laminated into a rear side encapsulation element, which, for reasons of clarity, is illustrated in FIG. 1 in a transparent, that is to say invisible, form. The non-laminated-in part of the plug-in device 22 forms a contact face 21 which is formed plane-parallel with respect to the rear side surface plane. The contact face 21 is suitable for receiving a complementary structure in the receiving region 19. The plug-in device 22 can contain electrical contacts, an electrical terminal, a diode and/or a bypass diode. Furthermore, the solar module 10 can have further plug-in devices 22 if necessary.

Figure 2:
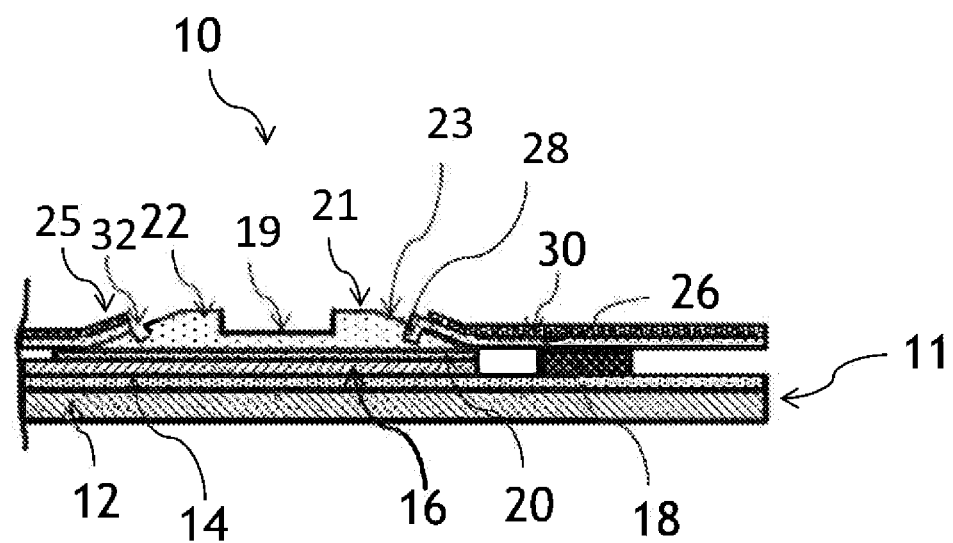
FIG. 2 shows a partial cross-sectional view of the solar module shown in FIG. 1.

FIG. 2 schematically shows a partial cross-sectional view (not to scale) of the solar module 10 according to the invention which is shown in FIG. 1. FIG. 2 is a cross-sectional view along the section shown in FIG. 1 along the line A-A. The solar module 10 has the front side encapsulation element 11 which comprises a glass panel 12 and an embedding polymer layer 14 which has, for example, ethylene vinyl acetate. The solar cell 16, which is connected to further solar cells by means of cell connectors (not shown) to form cell strings, is arranged on the embedding polymer layer 14. Cell strings which are located in parallel are electrically connected by means of cross-connectors 18. A layer 20, which is, for example, composed of the embedding polymer such as, for example, ethylene vinyl acetate, is optionally arranged under the plug-in device 22. The plug-in device 22 is arranged on the optional layer 20 or directly on a solar cell 16. A rear side encapsulation element 26 partially covers the plug-in device 22, specifically in the region of overlapping sections 25, and has an embedded polymer 28 such as, for example, ethylene vinyl acetate and a rear side encapsulation structure 30 such as, for example, a TEDLAR® film.

The plug-in device 22 has a contact face 21 which is formed plane parallel with respect to the rear side surface plane and is suitable for receiving a complementary structure. The receiving region 19, in the form of a cutout for receiving a complementary structure, is located in the contact face. In addition, the plug-in device 22 has two side faces 23 which each have an opening 32. The opening 32 is suitable for receiving, if necessary, embedding polymer 28 which flows during the lamination process. For example, it is shown in FIG. 2 that the opening 32, in the plan view of FIG. 2, is not filled with embedding polymer 28 on the left-hand side, and the opening 32, in the plan view of FIG. 2, is filled with embedding polymer 28 on the right-hand side. Whether the opening 32 is filled with the embedding polymer or not depends on whether during the manufacturing process of the solar module the embedding polymer 28 swells in such a way as to fill the opening 32 or not. The plug-in device 22 is partially laminated into the rear side encapsulation element 26, specifically in the region of overlapping sections 25. In particular, the sides 23 of the plug-in device 22 are partially laminated into the rear side encapsulation element 26, specifically in the region of the overlapping sections 25, with the result that the openings 32 can receive the embedding polymer 28 if necessary.

Figure 3:
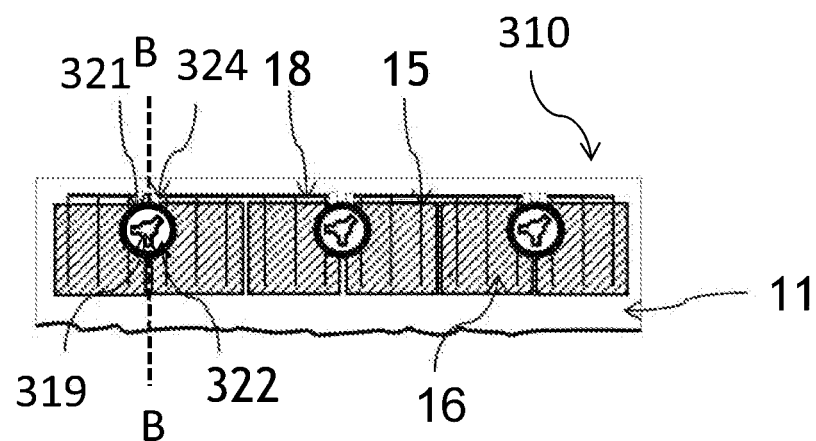
FIG. 3 shows a partial plan view of the rear side of a further solar module according to the invention.

FIG. 3 shows a partial plan view of the rear side of a solar module 310 according to the invention. The rear side encapsulation element is not shown in the partial plan view of the solar module 310. A multiplicity of solar cells 16 (of which six are shown by way of example) are arranged on a front side encapsulation element 11 and electrically connected to one another by means of cross-connectors 18. The cross-connectors 18 are electrically connected to busbars 15 which extend on the solar cells 16. A plug-in device 322 (of which three are shown) is arranged on the solar cells 16. The plug-in device 322 is partially laminated into a rear side encapsulation element, which, for reasons of clarity, is illustrated in FIG. 3 in a transparent, that is to say invisible form. The non-laminated-in part of the plug-in device 322 forms a contact face 321 which is formed plane-parallel with respect to the rear side surface plane. The contact face 321 is suitable for receiving a complementary structure in the receiving region 319. The plug-in device 322 contains electrical contacts 324 which are placed in contact with the cross-connector 18.

Figure 4:
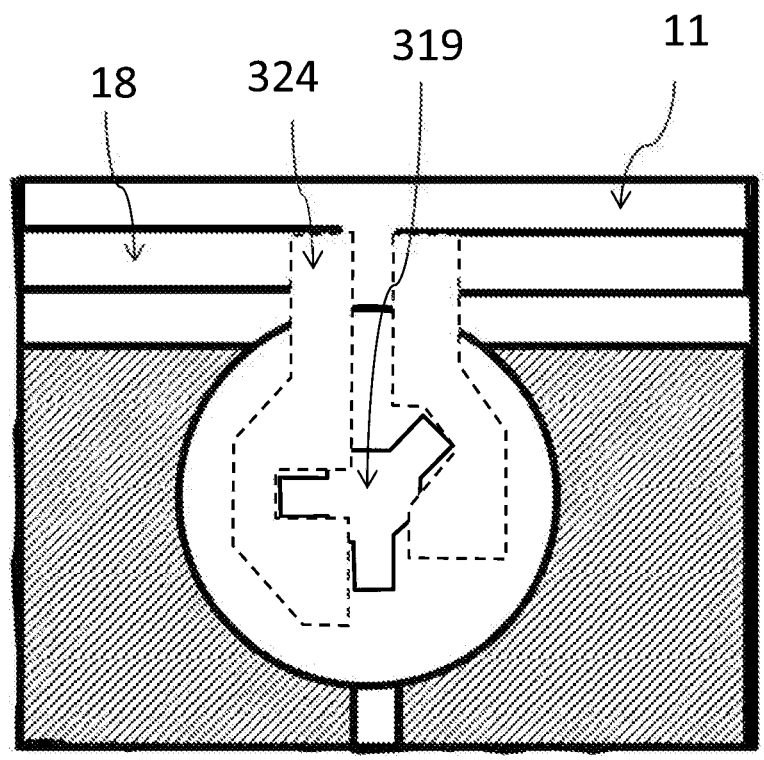
FIG. 4 shows an enlarged partial plan view of the rear side of the solar module shown in FIG. 3.

FIG. 4 schematically shows a partial plan view (not to scale) of the solar module 310 which is shown in FIG. 3. FIG. 4 shows the electrical contacts 324 which make electrical contact with the cross-connectors 18. Since the electrical contacts 324 are located in the plug-in device 322 and are concealed thereby in the plan view, they are shown by dashed lines. Parts of the electrical contacts 324 which are located in the receiving region 319 of the plug-in device 322 can, however, be seen in the plan view since the receiving region 319 represents a cutout in the plug-in device 322. The receiving region 319 and the electrical contacts 324 are configured in such a way that a complementary structure, which has, for example, a diode, can be placed in contact with them, i.e. the electrical components of the plug-in device 322 and of the complementary structure are connected to one another, and the receiving region 319 and the complementary structure are connected to one another by plugging, for example.

Figure 5:
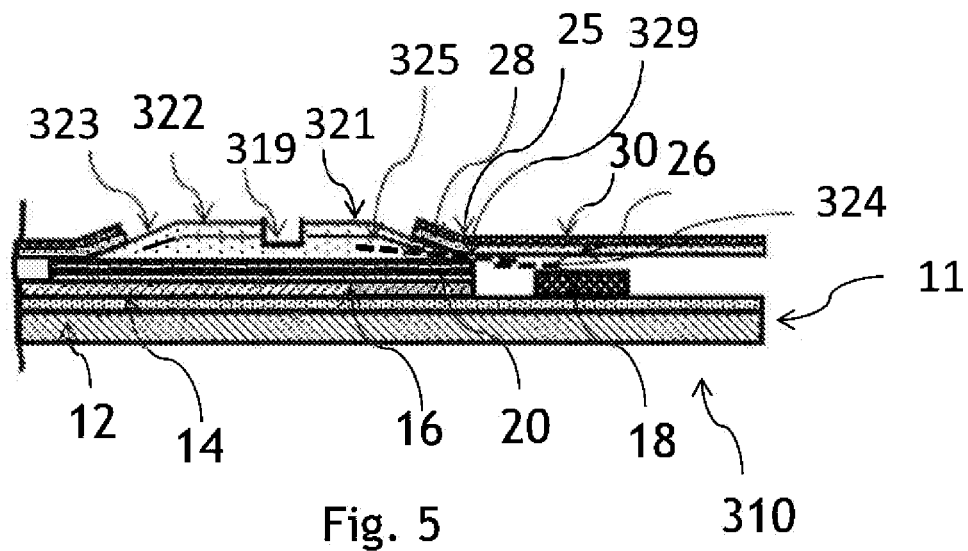
FIG. 5 shows a partial cross-sectional view of the solar module shown in FIG. 3.

FIG. 5 schematically shows a partial cross-sectional view (not to scale) of the solar module 310 (shown in FIG. 3) along the section of the line B-B.

The solar module 310 has the front side encapsulation element 11 which comprises a glass panel 12 and an embedding polymer layer 14 which has, for example, ethylene vinyl acetate. The solar cell 16, which is connected by means of cell connectors 18 to further solar cells to form cell strings (not shown), is arranged on the embedding polymer layer 14. A layer 20, which is composed, for example, of the embedding, polymer such as, for example, ethylene vinyl acetate, is optionally arranged under the plug-in device 322. The plug-in device 322 is arranged on the optional layer 20 or directly on the solar cell 16. A rear side encapsulation element 26 partially covers the plug-in device 322, specifically in the region of overlapping sections 25, and has an embedding polymer 28 such as, for example, ethylene vinyl acetate and a rear side encapsulation structure 30 such as, for example, a TEDLAR® film.

The plug-in device 322 comprises a housing which has side regions 323 which are partially laminated into the rear side encapsulation element 26, specifically in the region of the overlapping sections 25. Furthermore, the plug-in device 322 has a contact face 321 which is formed plane-parallel with respect to the rear side surface plane and which has a receiving region 319 in the form of a cutout which is suitable for receiving a complementary structure and can be connected thereto in a frictionally locking fashion. The plug-in device 322 has an opening 329 through which the electrical contacts 324 of the plug-in device 322 are guided from the housing into the interior of the solar module 310 and electrically connected to cross-connectors 18. The electrical contacts 324 which are guided through the opening 329 are usually insulated from the solar cell 16. In the event of the side of the solar cell 16 which faces the plug-in device 322 being connected to the cross-connector 18, that is to say having the same electrical potential, it is, however, also possible for there to be an electrical contact. In the receiving region 319 there is also an opening (not shown) which is suitable for connecting the electrical terminal 324 to an external device such as a plug device, wherein this opening is of watertight and dust tight design.

Figure 6:
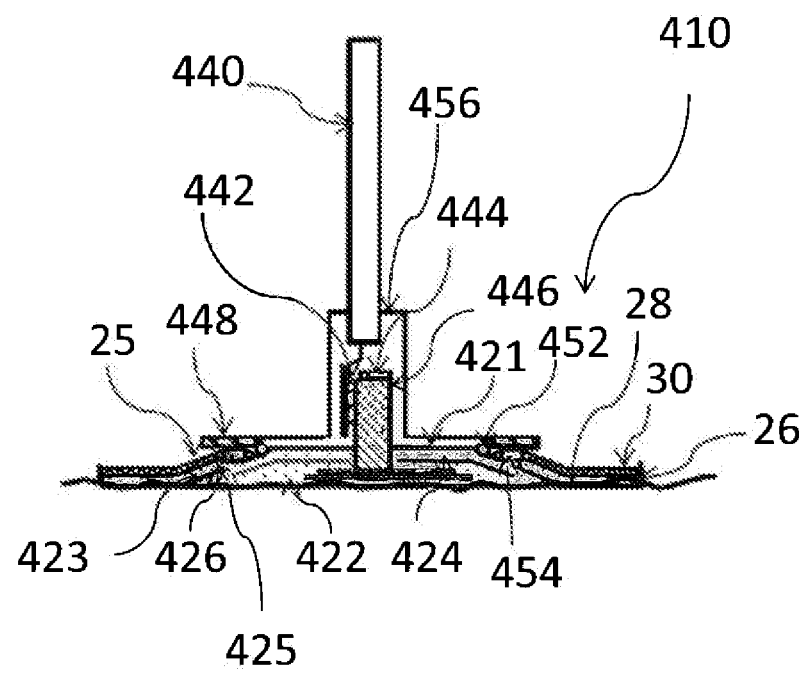
FIG. 6 shows a partial cross-sectional view of a further solar module according to the invention.

FIG. 6 shows a partial cross-sectional view of a further solar module 410 according to the invention. For the sake of illustration, only the plug-in device 422 is shown, the latter being laminated into a rear side encapsulation element 26 which has an embedding polymer 28 and a rear side encapsulation structure 30. The plug-in device 422 has a housing with sides 423 which are partially laminated into the rear side encapsulation element 26, specifically in the region of overlapping sections 25. Furthermore, the plug-in device 422 has two electrical contacts 424 which are connected to a diode in a plug insert, referred to below as diode 444. In order to protect the diode 444, a contact guard 446 is also arranged. Furthermore, laminating-in regions 426 of the overlapping section 25, at which laminating of the plug-in device 422 into the rear side encapsulation element 26 ends and the uncovered region of the plug-in device 422 begins, i.e. end regions of the overlapping sections 25 of the sides 423 and of the rear side encapsulation element 26, adjoin junction sections 425 which represent the junction of a laminated-in part of the plug-in device 422 and of an uncovered part of the plug-in device 422. The junction sections 425 are protected by a sealing means 454 such as an adhesive. The sealing means 454 also has the function of paneling regions 448, which are to be bonded to the sides 423. The paneling regions 448 are arranged on side regions of a housing 456 which partially encloses the diode 444, the contact guard 446, a contact 442 and a cable 440, if appropriate, and rests on a contact face 421 of the plug-in device 422, with the result that the diode 444 and the contact guard 446 are inserted into a receiving region (not shown) of the plug-in device 422 in order to connect to a complementary structure, and make contact with at least one electrical contact 424 of the plug-in device 422. A sealing means 452, preferably in the form of an adhesive, is arranged at the junction region between the housing 456 and the plug-in device 422. The diode 444 is connected to a contact 442 of a cable 440. The diode 444, the contact guard 446, the cable 440, the contact 442 and the housing 456 are part of the complementary structure which is connected to the plug-in device 422. The connection of the complementary structure and of the plug-in device 422 is in the manner of a bayonet closure, with the result that they are connected to one another in a stable but detachable fashion.

Figure 7:
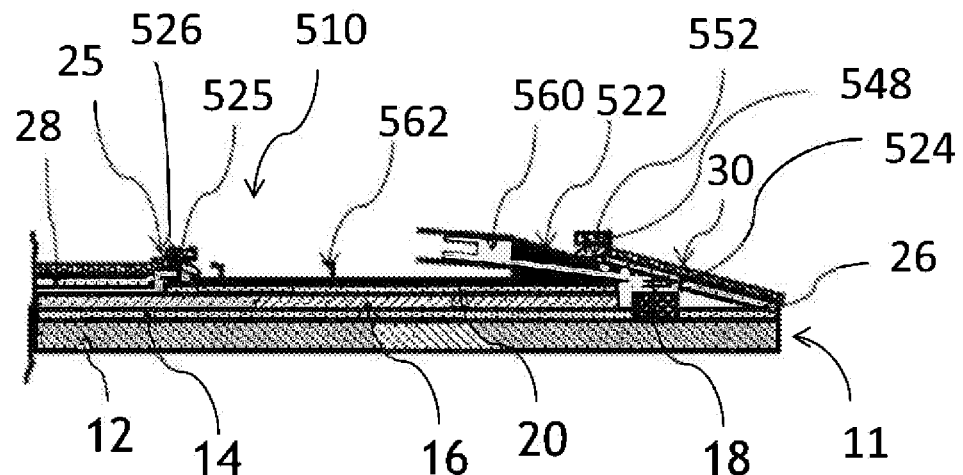
FIG. 7 shows a partial cross-sectional view of a further solar module according to the invention.

FIG. 7 shows a partial cross-sectional view of a further solar module 510 according to the invention. The solar module 510 has a front side encapsulation element 11 which comprises a glass panel 12 and an embedding polymer layer 14, which has, for example, ethylene vinyl acetate. The solar cell 16, which is connected by means of cell connectors (not shown) to further solar cells to form cell strings, is arranged on the embedding polymer layer 14. Cell strings which are located in parallel are electrically connected by means of cross-connectors 18. The solar module 510 also has a plug-in device 522 which is arranged on an optional layer 20, which is composed, for example, of the embedding polymer such as, for example, ethylene vinyl acetate, or directly on a solar cell 16. The rear side encapsulation element 26 partially covers the plug-in device 522, specifically in the region of overlapping sections 25, and has an embedding polymer 28 such as, for example, ethylene vinyl acetate and a rear side encapsulation structure 30 such as, for example, a TEDLAR® film. Laminating-in regions 526, at which the laminating of the plug-in device 522 into the rear side encapsulation element 26 ends, adjoin junction regions 525 which form a junction between the region of the plug-in device 522 covered by the rear side encapsulation element 26 and the uncovered region of the plug-in device 522. In each case a sealing means 552 and a paneling region 548 is arranged at the junction regions 525 and laminating-in regions 526, in order to protect the junction regions 525 and the laminating-in regions 526 particularly against the penetration of water and dust. The plug-in device 522 is electrically connected to the cross-connector 18 by means of the electrical terminal 524 which leaves the plug-in device 522 via an opening directed in the direction of the cross-connector 18. The electrical terminal 524 is also connected to the contact 560 which is arranged in the housing (shown in black) of the plug-in device 522 in such a way that it is protected against the environment. It is suitable for connecting to a complementary structure. Furthermore, the plug-in device 522 has, for connecting to the complementary structure, latching-in elements 562 which serve to connect the plug-in device 522 to the complementary structure in such a way that they cannot become detached from one another automatically.

Figure 8:
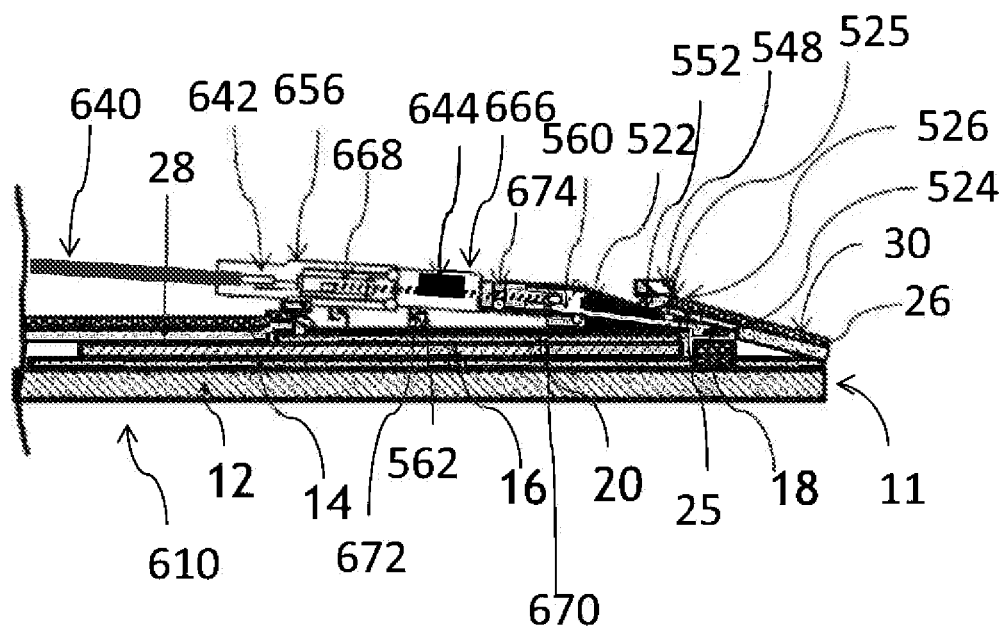
FIG. 8 shows a partial cross-sectional view of a further solar module according to the invention.

FIG. 8 shows a partial cross-sectional view of a further solar module 610 according to the invention. The solar module 610 corresponds to the solar module 510 shown in FIG. 7, to which reference is hereby made with the exception that the solar module 610 has a complementary structure. The complementary structure has a diode 644 which is arranged in a chip card 666. The chip card 666 comprises a housing which is of flat design. The diode 644 and the chip card 666 are of a complementary design to the plug-in device 522, with the result that the chip card 666 is connected in a frictionally locking and positively locking fashion to the plug-in device 522, and the diode 644 makes contact with the electrical contact 560 of the plug-in device 522. The chip card 666 and the diode 644 are part of the complementary structure. The diode 644 and the chip card 666 are also connected to a plug 656, which also has electrical contact elements 668 which are arranged in a housing. A cable 640 with an electrical contact 642 is also connected to the plug 656, wherein the electrical contact 642 makes contact with the electrical contact elements 668. Electrical lines 670 are arranged in the chip card 666 and the diode 644, with the result that there is electrical contact between the electrical contact elements 668 of the plug 656 and the electrical contact 560 of the plug-in device 522. The plug 656 has latching elements 672 which are of complementary design to the latching-in elements 562 of the plug-in device 622, with the result that they engage one in the other but are detachable, if necessary. Furthermore, in each case the plug-in device 522 and the chip card 666 and the plug 656 are each bonded to one another by means of adhesive 674.

FIG. 9 shows a schematically illustrated plan view of a further solar module 710 according to the invention. The plan view is directed onto the rear side of the solar module 710, wherein, however, a rear side encapsulation element, cross-connector and busbars of the solar module 710 are not shown. The solar module 710 has a front side encapsulation element 711 on which solar cells 716 are arranged. The solar module 710 also has plug-in devices 722 which are arranged on the solar cells 716 and/or the front side encapsulation element 711. The plug-in devices 722 each have a receiving region 719 for connecting to a complementary structure. The receiving region 719 is embodied as a cutout which is suitable for entering into a bayonet-closure-like connection with a complementary structure. As already described comprehensively, the plug-in devices 722 can add mechanical and/or electrical functionalities to the solar module 710 depending on their design. It is also conceivable that all eight plug-in devices 722 carry out a purely mechanical function and serve to mount the solar module in a frameless fashion and secure it mechanically at eight points.

FIG. 10 shows a partial cross-sectional view of a farther solar module 810 according to the invention. The solar module 810 has a front side encapsulation element 711, solar cells 716, a rear side encapsulation element 726 and plug-in devices 722. The plug-in devices 722 are laminated into the rear side encapsulation element 26 with the result that in each case overlapping sections 725 are formed, in which overlapping sections 725 parts of the rear side encapsulation element 726 overlap in each case with parts of the plug-in devices 722. The plug-in devices 722 have a receiving region 719 which configured as a cutout. Each receiving region 719 is connected to a complementary structure. The complementary structure has an underframe 782 on which latching elements 780 are arranged. The latching elements 780 are arranged in the respective receiving region 719 in such a way that they form a bayonet-like closure. The underframe 782 is suitable to be mounted on a roof of a house, a front of a building and/or a supporting frame.

The invention claimed is:

1. A solar module comprising:
a front side encapsulation element which forms a front side surface of the solar module,
a multiplicity of solar cells which are connected electrically to one another,
a rear side encapsulation element which forms a rear side surface of the solar module with a rear side surface plane and has a polymer plastic film, and
at least one plug-in device for connecting to a complementary structure, wherein the plug-in device is at least partially laminated into the rear side encapsulation element, in the region of an overlapping section, wherein the rear side encapsulation element has an opening and the plug-in device is arranged at least partially in the opening, wherein the opening of the rear side encapsulation element has a base area which is smaller than the base area of the plug-in device, the plug-in device projecting beyond the rear side surface plane of the solar module by a maximum of 15 mm.

2. The solar module as claimed in claim 1, wherein said plug-in device has in the direction perpendicular to the rear side surface, a maximum height which is less than 10% of an average diameter value which is formed from a maximum diameter and from a minimum diameter of the plug-in device which are represented in the plan view of the rear side surface plane.

3. The solar module as claimed in claim 1, wherein said plug-in device has or forms a housing.

4. The solar module as claimed in claim 1, wherein said plug-in device has at least a first contact, which is electrically connected to the solar cells, and at least a second contact, which is suitable for being contacted by the complementary structure.

5. The solar module as claimed in claim 1, wherein said plug-in device has at least one electrical terminal, at least one diode and/or at least one bypass diode.

6. The solar module as claimed in claim 1, wherein said plug-in device has a contact face for connecting the complementary structure, which contact face is arranged plane-parallel with respect to or in the rear side surface plane.

7. The solar module as claimed in claim 3, wherein said housing has at least two parts, and at least one laminated-in region of at least one part has at least one opening which permits a frictionally locking connection between the parts of the housing.

8. The solar module as claimed in claim 1, further comprising a laminating-in region in which the plug-in device is laminated into the rear side encapsulation element, the plug-in device has depressions which are suitable for accommodating rear side encapsulation element material.

9. The solar module as claimed in claim 1, wherein the plug-in device has at least one spacing element which extends between solar cells and is supported on the front side encapsulation element.

10. The solar module as claimed in claim 1, wherein the solar module comprises the complementary structure, and the complementary structure is connected to the plug-in device.

11. The solar module as claimed in claim 1, wherein the complementary structure and the plug-in device are connected to one another in the manner of a bayonet closure.

12. The solar module as claimed in claim 1, wherein the plug-in device and/or the complementary structure have a seal which is configured in such a way that the connecting region in which the complementary structure can be connected to the plug-in device is sealed.

13. The solar module as claimed in claim 1, wherein the plug-in device and/or the complementary structure have a sealing element which is arranged in such a way that it covers a junction region which constitutes the junction of a laminated-in part of the plug-in device and of an uncovered part of the plug-in device.

14. The solar module as claimed in claim 9, wherein the complementary structure contains at least one electrical terminal, at least one diode and/or at least one bypass diode.

15. The solar module as claimed in claim 1, wherein the plug-in device and/or the complementary structure is non-detachably connected to at least one cable.

16. The solar module as claimed in claim 1 wherein the plug-in device projects beyond the rear side surface plane of the solar module by a maximum of 6 mm.

17. The solar module as claimed in claim 1 wherein the plug-in device projects beyond the rear side surface plane of the solar module by a maximum of 4 mm.

18. The solar module as claimed in claim 2 wherein the maximum height is less than 8%.

19. The solar module as claimed in claim 2 wherein the maximum height is less than 5%.

20. The solar module as claimed in claim 4, wherein said housing has at least two parts, and at least one laminated-in region of at least one part of the at least two parts has at least one opening which permits a frictionally locking connection between the parts of the housing.

* * * * *

UNITED STATES PATENT AND TRADEMARK OFFICE
CERTIFICATE OF CORRECTION

| | |
|---|---|
| PATENT NO. | : 9,577,119 B2 |
| APPLICATION NO. | : 13/912446 |
| DATED | : February 21, 2017 |
| INVENTOR(S) | : Andreas Pfennig and Maximilian Scherff |

Page 1 of 1

It is certified that error appears in the above-identified patent and that said Letters Patent is hereby corrected as shown below:

On the Title Page

In the Abstract (57), Line 8: Delete "connecting" and insert --for connecting--

In the Claims

Column 13, Line 39 Claim 2: Delete "has in" and insert --has, in--

Signed and Sealed this
Second Day of May, 2017

Michelle K. Lee
*Director of the United States Patent and Trademark Office*